United States Patent
Hashiguchi et al.

(10) Patent No.: US 10,670,532 B2
(45) Date of Patent: Jun. 2, 2020

(54) MEASURING APPARATUS COMPRISING A LINE ENCLOSURE DISPOSED AROUND AN ELECTRICAL CONNECTION LINE ELECTRICALLY CONNECTED TO THE CONDUCTIVE PART OF AN OPTICAL WINDOW AND A HOUSING

(71) Applicants: Masafumi Hashiguchi, Kanagawa (JP); Toshio Yanata, Kanagawa (JP); Yasuhide Fukushima, Tokyo (JP); Mikihiko Takao, Miyazaki (JP)

(72) Inventors: Masafumi Hashiguchi, Kanagawa (JP); Toshio Yanata, Kanagawa (JP); Yasuhide Fukushima, Tokyo (JP); Mikihiko Takao, Miyazaki (JP)

(73) Assignee: Ricoh Company, Ltd., Tokyo (JP)

(*) Notice: Subject to any disclaimer, the term of this patent is extended or adjusted under 35 U.S.C. 154(b) by 116 days.

(21) Appl. No.: 16/057,065

(22) Filed: Aug. 7, 2018

(65) Prior Publication Data

US 2019/0049389 A1 Feb. 14, 2019

(30) Foreign Application Priority Data

Aug. 10, 2017 (JP) .................. 2017-155413
Jun. 27, 2018 (JP) .................. 2018-121956

(51) Int. Cl.
*G01N 21/84* (2006.01)
*G01J 1/04* (2006.01)
(Continued)

(52) U.S. Cl.
CPC ........ *G01N 21/8422* (2013.01); *G01J 1/0271* (2013.01); *G01J 1/0407* (2013.01);
(Continued)

(58) Field of Classification Search
CPC .... G01J 1/0271; G01J 1/44; G01J 2001/0276; G01N 21/59; G01N 21/8422; G01N 21/958; G01S 7/4811; H01L 31/0203
(Continued)

(56) References Cited

U.S. PATENT DOCUMENTS 4,441,023 A * 4/1984 Doctor .................. G01J 5/34
250/338.3

FOREIGN PATENT DOCUMENTS

JP 5-133892 5/1993
JP 8-015161 1/1996
(Continued)

OTHER PUBLICATIONS

Extended European Search Report dated Dec. 4, 2018 in corresponding Application No. 18184817.7.

*Primary Examiner* — Que Tan Le
(74) *Attorney, Agent, or Firm* — Harness, Dickey & Pierce, P.L.C.

(57) ABSTRACT

A measuring apparatus includes a light receiving device, a housing, an optical window, an electrical connection line, and a line enclosure. The light receiving device receives light and output a signal. The housing, made of a conductive material, covers the light receiving device. The optical window transmits the light. The optical window includes a conductive part having conductivity. The electrical connection line transmits the signal. The line enclosure is disposed around the electrical connection line and electrically connected to the conductive part and the housing.

7 Claims, 11 Drawing Sheets

(51) Int. Cl.
*G01J 1/44* (2006.01)
*G01J 1/02* (2006.01)
*H01L 31/0203* (2014.01)
*G01N 21/59* (2006.01)
*G01N 21/958* (2006.01)
*G01S 7/481* (2006.01)
*G01N 21/88* (2006.01)

(52) U.S. Cl.
CPC ............. *G01J 1/44* (2013.01); *G01N 21/59* (2013.01); *G01N 21/958* (2013.01); *G01S 7/4811* (2013.01); *H01L 31/0203* (2013.01); *G01J 2001/0276* (2013.01); *G01N 2021/8832* (2013.01)

(58) Field of Classification Search
USPC .................................. 250/214 R, 239, 214.1
See application file for complete search history.

(56) References Cited

FOREIGN PATENT DOCUMENTS

| | | |
|---|---|---|
| JP | H08172248 A | 7/1996 |
| JP | 2001-244483 | 9/2001 |
| JP | 2004-012411 | 1/2004 |
| JP | 2010276407 A | 12/2010 |
| JP | 2016-148535 | 8/2016 |

\* cited by examiner

MEASURING APPARATUS COMPRISING A LINE ENCLOSURE DISPOSED AROUND AN ELECTRICAL CONNECTION LINE ELECTRICALLY CONNECTED TO THE CONDUCTIVE PART OF AN OPTICAL WINDOW AND A HOUSING

CROSS-REFERENCE TO RELATED APPLICATIONS

This patent application is based on and claims priority pursuant to 35 U.S.C. § 119(a) to Japanese Patent Application Nos. 2017-155413, filed on Aug. 10, 2017, and 2018-121956, filed on Jun. 27, 2018, in the Japan Patent Office, the entire disclosure of each of which is hereby incorporated by reference herein.

BACKGROUND

Technical Field

Embodiments of the present disclosure relate to a measuring apparatus.

Related Art

Measurement of chemical substances using chemiluminescence or biochemical luminescence is proceeded in various fields because such measurement allows very low concentration measurement, specific measurement, and the like.

In general, the light intensity of such chemiluminescence is relatively low. Therefore, there are strong demands for measuring apparatuses that detect weak light generated from light emitting substances.

SUMMARY

In one embodiment of the present disclosure, a novel measuring apparatus includes a light receiving device, a housing, an optical window, an electrical connection line, and a line enclosure. The light receiving device receives light and output a signal. The housing, made of a conductive material, covers the light receiving device. The optical window transmits the light. The optical window includes a conductive part having conductivity. The electrical connection line transmits the signal. The line enclosure is disposed around the electrical connection line and electrically connected to the conductive part and the housing.

BRIEF DESCRIPTION OF THE DRAWINGS

A more complete appreciation of the embodiments and many of the attendant advantages and features thereof can be readily obtained and understood from the following detailed description with reference to the accompanying drawings, wherein.

The accompanying drawings are intended to depict embodiments of the present disclosure and should not be interpreted to limit the scope thereof. Also, identical or similar reference numerals designate identical or similar components throughout the several views.

DETAILED DESCRIPTION

Figure 1:
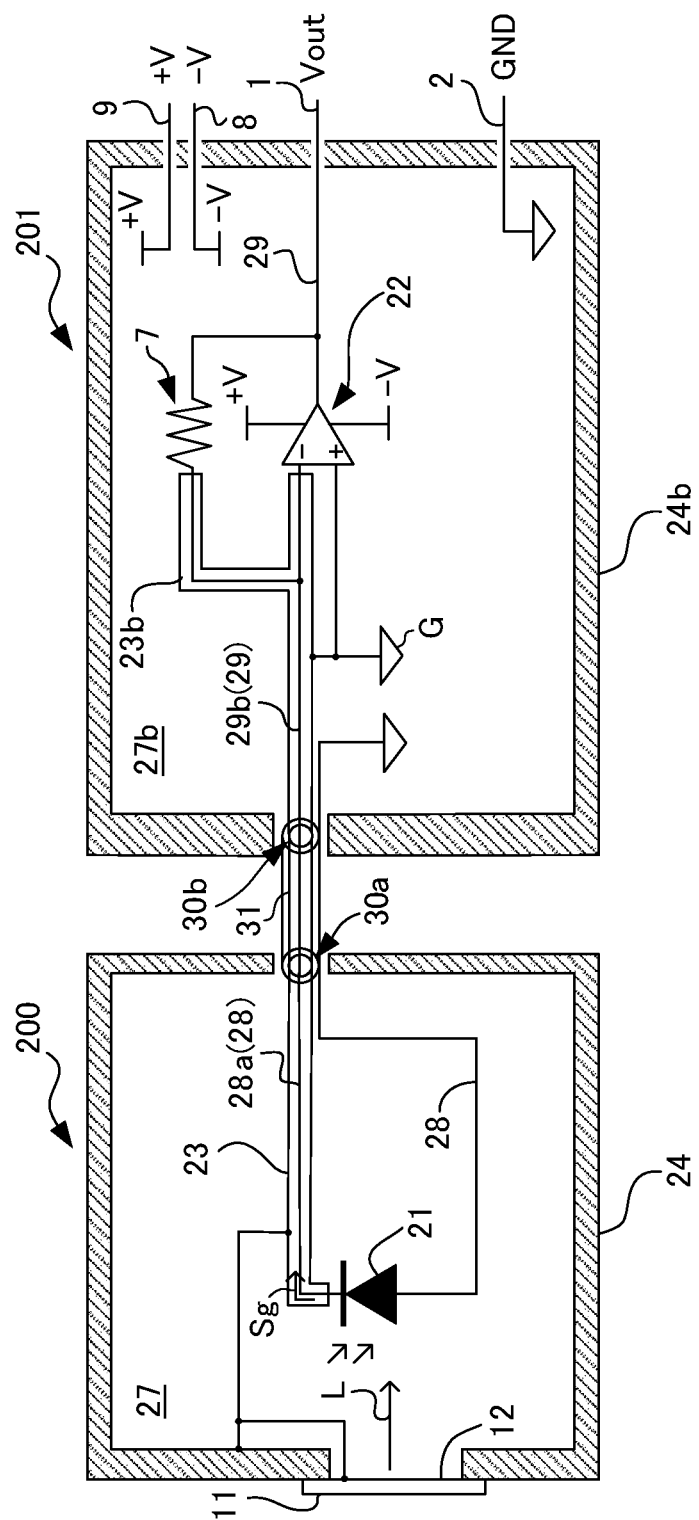
FIG. 1 is a schematic view of a measuring apparatus according to an embodiment of the present disclosure, with an amplifying apparatus.

In describing embodiments illustrated in the drawings, specific terminology is employed for the sake of clarity. However, the disclosure of the present specification is not intended to be limited to the specific terminology so selected and it is to be understood that each specific element includes all technical equivalents that have a similar function, operate in a similar manner, and achieve a similar result.

Although the embodiments are described with technical limitations with reference to the attached drawings, such description is not intended to limit the scope of the disclosure and not all of the components or elements described in the embodiments of the present disclosure are indispensable to the present disclosure.

In a later-described comparative example, embodiment, and exemplary variation, for the sake of simplicity like reference numerals are given to identical or corresponding constituent elements such as parts and materials having the same functions, and redundant descriptions thereof are omitted unless otherwise required.

As used herein, the singular forms "a", "an", and "the" are intended to include the plural forms as well, unless the context clearly indicates otherwise.

Referring to the drawings, wherein like reference numerals designate identical or corresponding parts throughout the several views, embodiments of the present disclosure are described below.

Initially with reference to FIG. 1, a description is given of a measuring apparatus 200 according to an embodiment of the present disclosure.

FIG. 1 is a schematic view of the measuring apparatus 200 with an amplifying apparatus 201.

The measuring apparatus 200 includes, e.g., a light receiving device 21, a housing 24, and an optical window 11. The light receiving device 21 receives weak detection light L and generates a signal. The housing 24 is made of a conductive material to cover at least the light receiving device 21.

The optical window 11 is disposed as a part of the housing 24 to transmit the detection light L. The optical window 11 includes a conductive part 12 having conductivity.

The measuring apparatus 200 further includes an external connector 30a, a guard ring 23, and electrical connection lines 28 such as electrical wires and cables that electrically connect components. The external connector 30a is connected to the light receiving device 21 via the electrical connection line 28. The guard ring 23 is disposed around an electrical connection line 28a as a signal line, thereby serving as a line enclosure.

As illustrated in FIG. 1, a cable 31 couples the measuring apparatus 200 to the amplifying apparatus 201.

The light receiving device 21 is an element that outputs an electrical signal Sg upon reception of the detection light L. Examples of the light receiving device 21 include a photodiode, a phototransistor, and a photo integrated circuit (IC).

The housing 24 is a conductive metal material disposed to cover at least the light receiving device 21.

Although the housing 24 is a metal box in the present embodiment, the housing 24 is not particularly limited to a metal provided that the housing 24 is a material having conductivity.

The optical window 11 is made of glass, resin, or the like spanning an opening of the housing 24 as illustrated in FIG. 1, so as to transmit the detection light L. An indium tin oxide (ITO) film is vapor-deposited on a surface of the optical window 11. In other words, the optical window 11 has a surface provided with the conductive part 12 that is a portion subjected to a conductive treatment.

Note that the housing 24 and the conductive part 12 are electrically connected to each other at identical electric potentials.

The conductive part 12 is the ITO film vapor-deposited on the surface of the optical window 11. The conductive part 12 has conductivity and good transparency with respect to a wavelength band of the detection light L. That is, the conductive part 12 transmits the detection light L.

With such a configuration, the conductive part 12 is electrically connected to the housing 24 without disturbing the weak detection light L. Consequently, the measuring apparatus 200 is covered with grounds of identical electric potentials, thereby reducing noise due to the influence from outside. Note that the measuring apparatus 200 may be covered with any other forms of identical electric potentials.

With the conductive treatment such as vapor deposition, the present embodiment reduces the number of parts.

In addition, even if the optical window 11 has a special shape such as a lens shape, the conductive treatment prevents distortion of the optical window 11, thereby retaining a suitable shape of the optical window 11.

Note that, in the present embodiment, the conductive treatment includes vapor-deposition of the ITO film, but is not limited thereto. Alternatively, the conductive treatment may include vapor-deposition of a transparent conductive film such as fluorine doped tin oxide (FTO), antimony doped tin oxide (ATO), or gallium-doped zinc oxide (GZO).

In the present embodiment, the conductive part 12 is the ITO film vapor-deposited on the surface of the optical window 11. Alternatively, a transparent conductive sheet or film, such as ST-PET (registered trademark) transparent conductive sheet made by Achilles Corporation or a carbon nanotube (CNT) film made by Toray Industries, Inc., may be disposed in contact with the surface of the optical window 11 as the conductive part 12.

Using such a transparent conductive film as the conductive part 12 reduces the number of man-hours for conductive treatment of the optical window 11 and facilitates covering of the optical window 11 spanning the opening of the housing 24, with a conductive material.

In the present embodiment, the electrical connection lines 28 are disposed on a circuit board 27 on which the light receiving device 21 is disposed.

The external connector 30a is coupled to the cable 31 that transmits the electrical signal Sg from the light receiving device 21 to the amplifying apparatus 201. In the present example, the external connector 30a is a triaxial connector.

As illustrated in FIG. 1, the measuring apparatus 200 is coupled to the cable 31 via the external connector 30a. Alternatively, for example, the cable 31 may be directly coupled to the circuit board 27 of the measuring apparatus 200.

The amplifying apparatus 201 includes an external connector 30b, an amplifier 22, a housing 24b, a guard ring 23b, and electrical connection lines 29 such as electrical wires and cables that electrically connect components. The amplifier 22 is connected to the external connector 30b via the electrical connection line 29 to amplify the electrical signal Sg output by the measuring apparatus 200. The housing 24b is made of a conductive material to cover at least the amplifier 22. The guard ring 23b is disposed around an electrical connection line 29b as a signal line, thereby serving as a line enclosure. The external connector 30b is coupled to the cable 31 that transmits the electrical signal Sg output from the measuring apparatus 200 to the amplifying apparatus 201. In the present example, the external connector 30b is a triaxial connector.

As illustrated in FIG. 1, the amplifying apparatus 201 is coupled to the cable 31 via the external connector 30b. Alternatively, for example, the cable 31 may be directly coupled to a circuit board 27b of the amplifying apparatus 201.

In the present embodiment, the electrical connection lines 29 are disposed on the circuit board 27b on which the amplifier 22 is disposed.

In the present embodiment, the amplifier 22 is an operational amplifier. Upon receiving the electrical signal Sg from the light receiving device 21, the amplifier 22 amplifies the electrical signal Sg according to a current-voltage (I/V) conversion resistor 7.

In the present embodiment, the amplifier 22 is capable of amplifying the electrical signal Sg about $10^9$ times.

The housing 24b is a conductive metal material disposed to cover at least the amplifier 22. Although the housing 24b is a metal box in the present embodiment, the housing 24b is not particularly limited to a metal provided that the housing 24b is a material having conductivity.

The cable 31 produces substantially the same effect as surrounding or enclosing a signal line with a guard ring. In the present example, the cable 31 is a triaxial connector.

In the measuring apparatus 200, the guard ring 23 is a surround or an enclosure made of a conductive material and disposed around the electrical connection line 28a. The guard ring 23 surrounds at least the electrical connection line 28a of the electrical connection lines 28. The electrical connection line 28a connects the light receiving device 21 and the external connector 30a. That is, in the present embodiment, the guard ring 23 serves as a line enclosure.

Similarly, in the amplifying apparatus 201, the guard ring 23b surrounds the electrical connection line 29b that connects the external connector 30b and the amplifier 22.

In other words, the guard ring 23 is disposed around the electrical connection line 28a as a signal line so as to reduce leakage current from the electrical connection line 28a to the surroundings. Similarly, the guard ring 23b is disposed around the electrical connection line 29b as a signal line so as to reduce leakage current from the electrical connection line 29b to the surroundings. Specifically, the guard rings 23 and 23b surround, in a plane, the electrical connection lines 28a and 29a, respectively, on a surface of the respective circuit boards 27 and 27b to reduce adverse influence of noise.

The guard rings 23 and 23b are conductive lines such as wires or cables made of substantially the same material as the material of the electrical connection lines 28 and 29, respectively, for example.

In the measuring apparatus 200, the guard ring 23 is electrically connected to the housing 24 and the conductive part 12 at identical electric potentials. In other words, the conductive part 12, the housing 24, and the guard ring 23 have identical electric potentials.

The guard ring 23 may be electrically connected to the housing 24 and the conductive part 12 via a ground G, which is a reference potential illustrated as an inverted triangle in FIG. 1.

A description is now given of how to reduce noise with the guard ring 23 described above.

Typically, a large number of noise sources for weak current signals are known such as superimposition on the signals by electrostatic induction from outside.

In order to suppress such disturbance from outside, electrostatic shielding is well known. For example, by grounding the surroundings of a signal line, a shielded cable electrostatically shields the signal line, thereby reducing noise caused by electrostatic induction.

Figure 2:
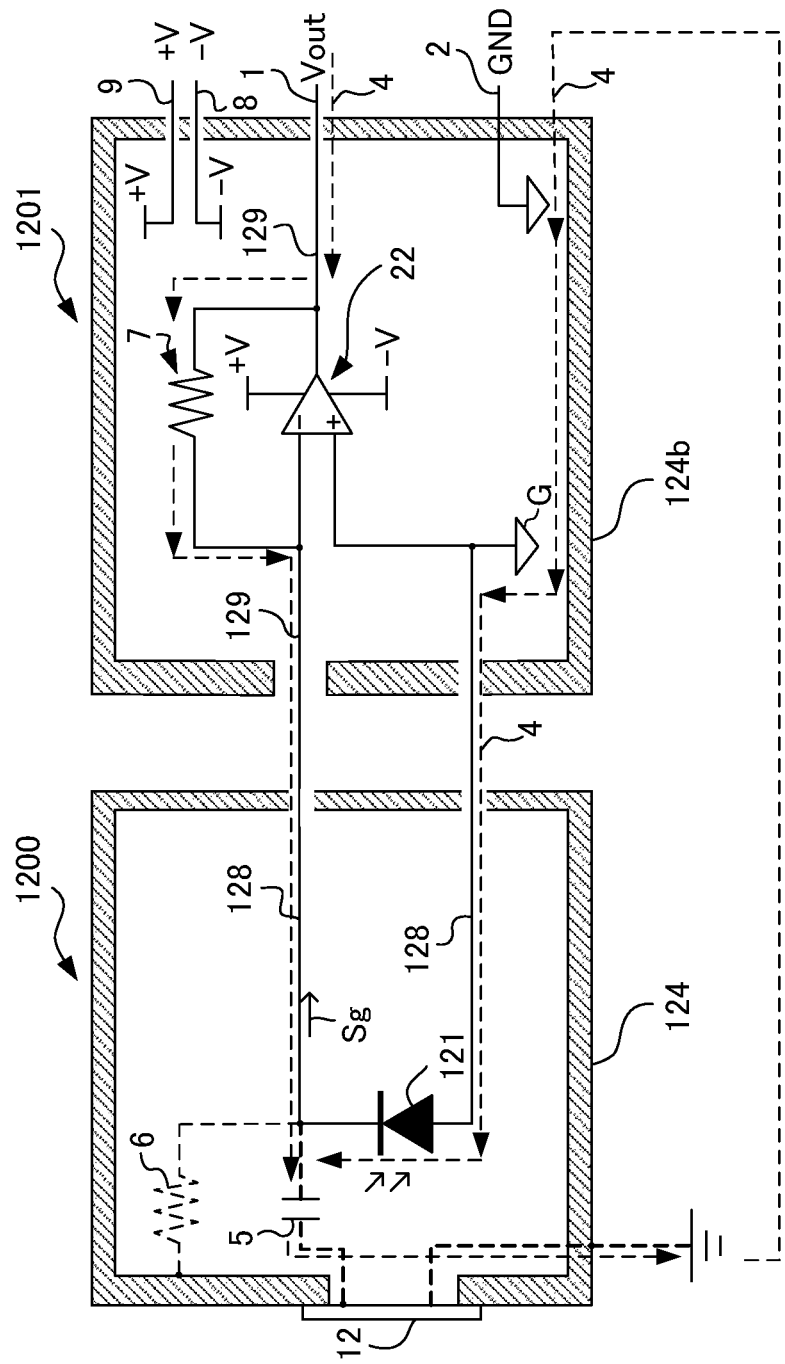
FIG. 2 is a schematic view of a comparative measuring apparatus with a comparative amplifying apparatus, simulating occurrence of common mode noise.

FIG. 2 is a schematic view of a comparative measuring apparatus 1200 with a comparative amplifying apparatus 1201, simulating occurrence of common mode noise.

For example, simply grounding housings 124 and 124b as illustrated in FIG. 2 by using conventional technique may not prevent a common-mode noise current 4 from being generated in electrical connection lines 1, 2, 8, and 9 connected outside. The common-mode noise current 4 may be generated due to induction or electromagnetic waves caused by the surrounding environment.

A stray capacitance C (i.e., stray capacitance 5 in FIG. 2) between a light receiving device 121 and the housing 124 as an electrostatic shield and an air resistance R (i.e., impedance 6 in FIG. 2) generate a loop of the common-mode noise current 4 that commonly flows through electrical connection lines 128 and 129 on the circuit boards from the ground and return to the ground from an opposite side, as illustrated by broken lines in FIG. 2.

Since such a loop of the electric current via the ground is generated involving the electrical connection lines 128 and 129, the electric potential of the signal line fluctuates with respect to the ground. As a consequence, voltage as an output signal is converted to and amplified as noise voltage.

Normally, the stray capacitance (i.e., stray capacitance 5 in FIG. 2) between the light receiving device 121 and the housing 124 or a stray capacitance between the ground and the electrical connection lines 128 and 129 is very low. In a high impedance circuit as in the present embodiment, even with a very low stray capacitance, the impedance is relatively low, causing a flow of the common-mode noise current 4.

Note that the flow of the common-mode noise current 4 as described above is an example of a noise generation mechanism. There are other paths where noise occurs.

In order to reduce such common mode noise, a circuit is to be prepared while preventing the electrical connection line 28a as a signal line from being a flow path of the common-mode noise current 4.

That is, the guard ring 23 surrounds at least the electrical connection line 28a to prevent leakage current to the surroundings on the surface of the circuit board 27. In addition, the guard ring 23 is electrically connected to the housing 24 and the conductive part 12, thereby being equal in electric potential to the housing 24. As a consequence, the stray capacitance is further reduced.

Since a common-mode noise current passes through a path having the lowest impedance, the leakage current tends to flow most on the surface of the circuit board 27.

Figure 3A:
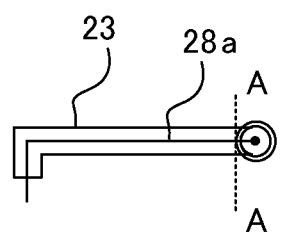
FIG. 3A is a partial view of the measuring apparatus of FIG. 1, illustrating a guard ring surrounding an electrical connection line.
Figure 3B:
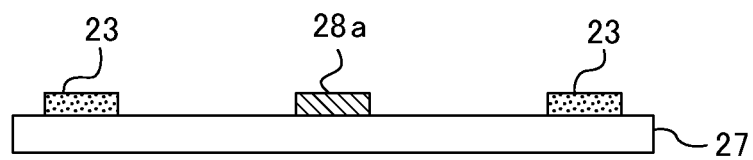
FIG. 3B is a cross-sectional view of the guard ring surrounding the electrical connection line illustrated in FIG. 3A.

FIG. 3A is a partial view of the measuring apparatus 200 of FIG. 1, illustrating the guard ring 23 surrounding the electrical connection line 28a. FIG. 3B is a cross-sectional view of the guard ring 23 surrounding the electrical connection line 28a illustrated in FIG. 3A, along a line AA.

In order to prevent such leakage current, in the present embodiment, the guard ring 23 is disposed to surround the electrical connection line in a plane on the surface of the circuit board 27 as illustrated in FIGS. 3A and 3B.

Alternatively, for example, the guard ring 23 may surround the electrical connection line 28a, regarded as a shielded signal line, not only in a plane on the surface of the circuit board 27 but also in a depth direction (i.e., height direction) of the circuit board 27.

Even when the common-mode noise current is generated by, e.g., induction from outside as the guard ring 23 is electrically connected to the housing 24 and the conductive part 12 of the optical window 11, the current flows to the guard ring 23, thereby ending the loop. Accordingly, the influence of noise on the electrical connection line 28a is reduced.

Thus, the guard ring 23 disposed around the electrical connection line 28a and connected to the grounds suppresses the influence on the signals passing though the electrical connection line 28a, even when the common-mode noise current is generated.

With such a configuration, the measuring apparatus 200 accurately detects weak light having a very low light intensity.

Further, in the present embodiment, the optical window 11 spanning the opening of the housing 24 includes the conductive part 12. The conductive part 12, the housing 24, and the guard ring 23 are electrically connected to each other. With such a configuration, the entire housing 24 has an electrostatic shielding effect against disturbance. Accordingly, the measuring apparatus 200 of the present embodiment accurately detects weak light having a very low light intensity while effectively reducing noise.

A description is now given of variations of the measuring apparatus 200 and the amplifying apparatus 201 described above.

Figure 4:
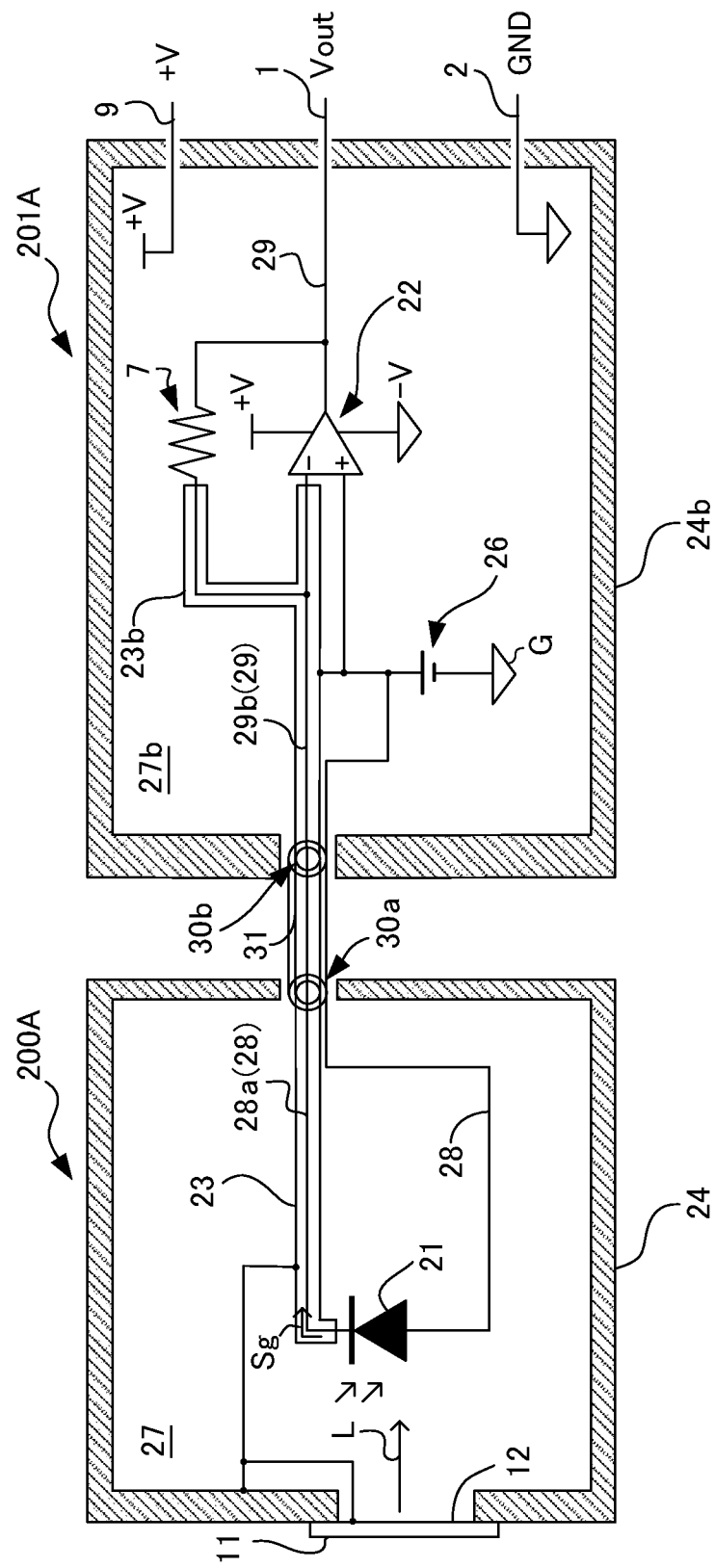
FIG. 4 is a schematic view of a first variation of the measuring apparatus and the amplifying apparatus illustrated in FIG. 1.

Initially with reference to FIG. 4, a description is now given of a first variation of the measuring apparatus 200 and the amplifying apparatus 201 illustrated in FIG. 1.

FIG. 4 is a schematic view of a measuring apparatus 200A and an amplifying apparatus 201A.

An offset may be provided between the guard ring 23, the housing 24, the conductive part 12, and the ground by using a direct current (DC) voltage source 26.

Such a configuration holds the entire measuring system including the light receiving device 21 at a constant voltage with respect to the housing 24 and the ground. Since the electric resistance and impedance of air between the housing 24 and the guard ring 23 are much larger than the electric resistance of portions connected as a circuit, a common-mode noise current does not flow, preventing generation of noise voltage. Accordingly, measurement accuracy is enhanced.

There is also an advantage that the amplifier 22 is driven by a single power supply.

Figure 5:
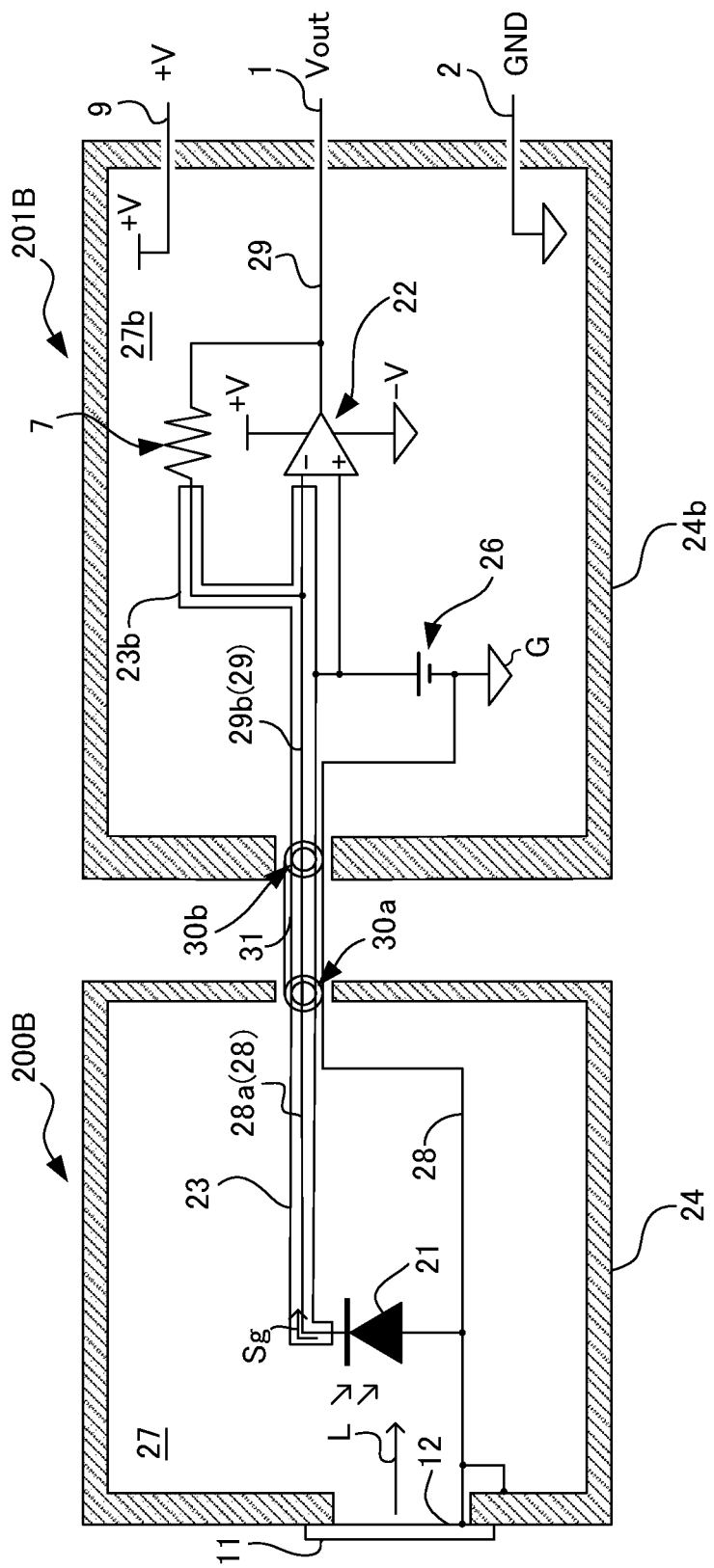
FIG. 5 is a schematic view of a second variation of the measuring apparatus and the amplifying apparatus illustrated in FIG. 1.

Referring now to FIG. 5, a description is given of a second variation of the measuring apparatus 200 and the amplifying apparatus 201 illustrated in FIG. 1.

FIG. 5 is a schematic view of a measuring apparatus 200B and an amplifying apparatus 201B.

In FIG. 5, the guard ring 23, the housing 24, and the conductive part 12 are connected to each other via the DC voltage source 26.

Note that, in the present variation, the DC voltage source 26 is disposed to offset the electric potentials of the guard ring 23 and a positive (+) side of the amplifier 22 from the ground. The disposition of the DC voltage source 26 is not limited thereto.

Such a configuration holds the guard ring 23 at a constant voltage with respect to the housing 24 and the ground. In other words, a constant voltage is held between the guard ring 23 and the housing 24, and between the guard ring 23 and the ground. Therefore, a common-mode noise current does not flow to the guard ring 23, preventing generation of noise voltage. Accordingly, measurement accuracy is enhanced.

Air resistance between the potential of the guard ring 23, the potential of the conductive part 12, and the potential of the housing 24 might generate a direct noise current. However, such electrical resistance and impedance are much larger than the electrical resistance of portions connected as a circuit, and therefore a common-mode noise current does not flow, preventing generation of noise voltage. Accordingly, measurement accuracy is enhanced.

With respect to the conductive part 12, a transparent conductive film may be used as the conductive part 12.

Figure 6:
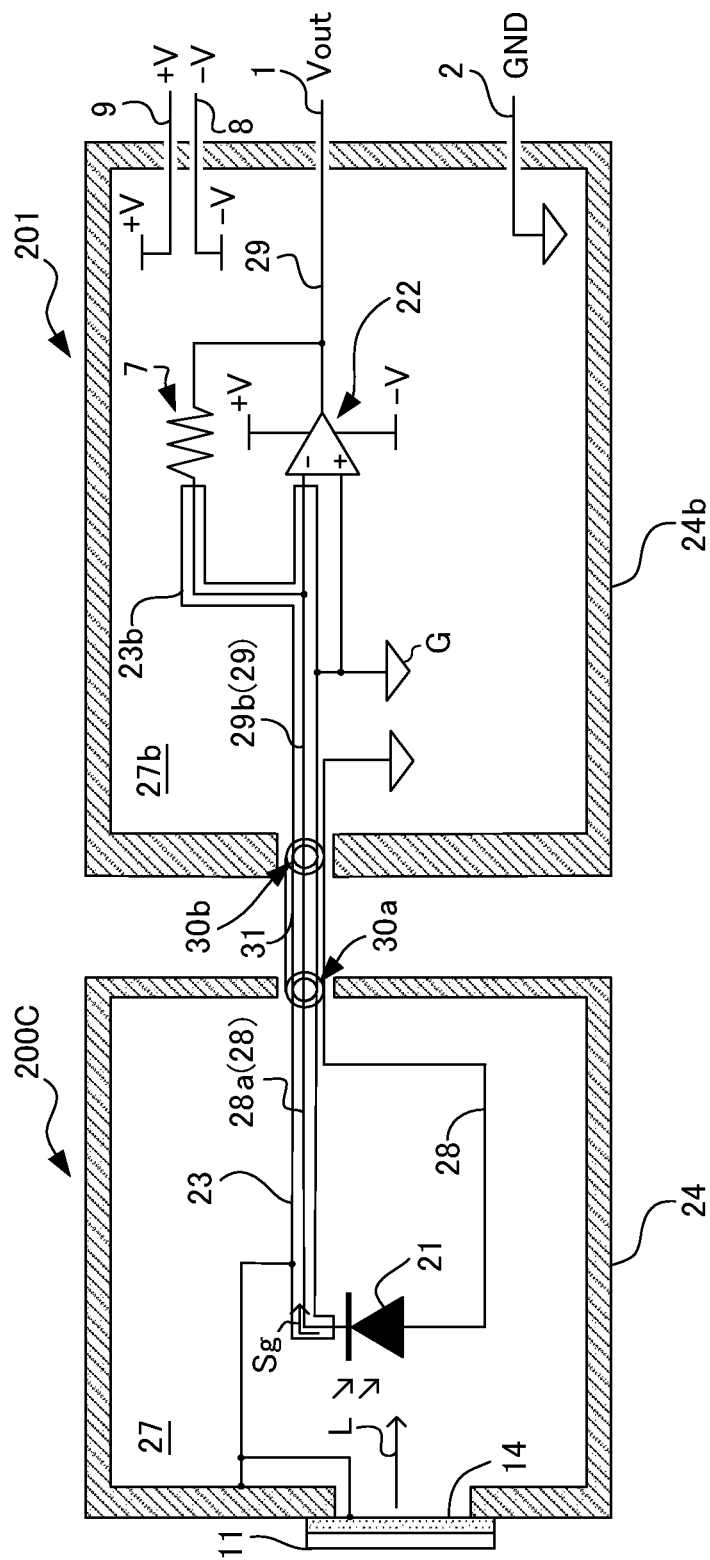
FIG. 6 is a schematic view of the amplifying apparatus and a measuring apparatus incorporating a transparent conductive film as an example of a conductive part illustrated in FIG. 1.

Referring now to FIG. 6, a description is given of an example of the conductive part 12.

FIG. 6 is a schematic view of the amplifying apparatus 201 and a measuring apparatus 200C incorporating a transparent conductive film 14 as an example of the conductive part 12 illustrated in FIG. 1.

As illustrated in FIG. 6, the transparent conductive film 14 is disposed in contact with the surface of the optical window 11.

Such a configuration reduces the number of manufacturing steps of the optical window 11 while facilitating electrostatic shielding with the housing 24 and the conductive part 12 of the optical window 11.

Figure 7:
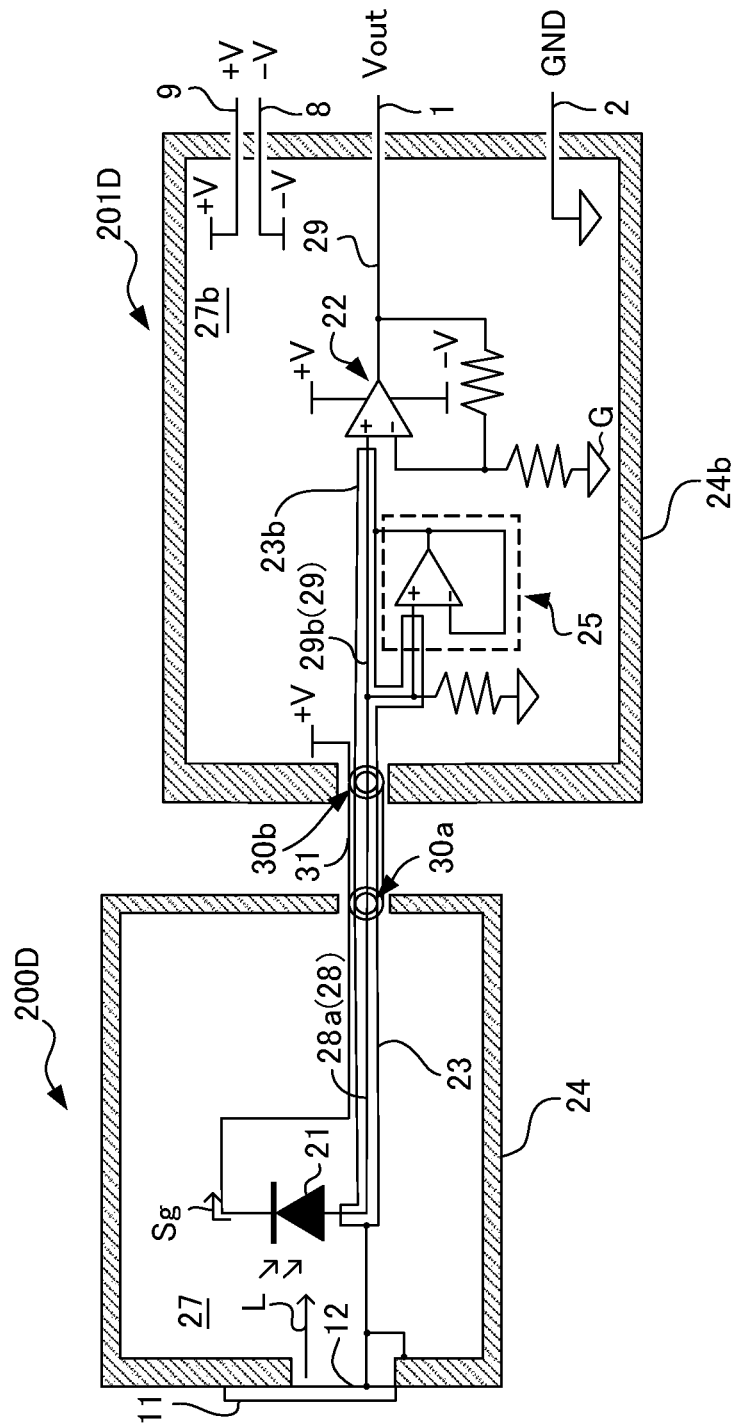
FIG. 7 is a schematic view of a third variation of the measuring apparatus and the amplifying apparatus illustrated in FIG. 1.

Referring now to FIG. 7, a description is given of a third variation of the measuring apparatus 200 and the amplifying apparatus 201 illustrated in FIG. 1.

FIG. 7 is a schematic view of a measuring apparatus 200D and an amplifying apparatus 201D.

The amplifying apparatus 201 may include a buffer circuit 25.

An input side of the buffer circuit 25 is connected to the electrical connection line 29b as a signal line. On the other hand, an output side of the buffer circuit 25 is connected to the guard ring 23b. Therefore, without affecting signals from the light receiving device 21, the buffer circuit 25 contributes to enhancement of the light receiving device 21 in response speed and in output dynamic range.

Referring now to FIGS. 8 through 14, a description is given of a configuration in which the amplifying apparatus 201 is configured as an integrated part of the measuring apparatus (e.g., measuring apparatus 200).

Figure 8:
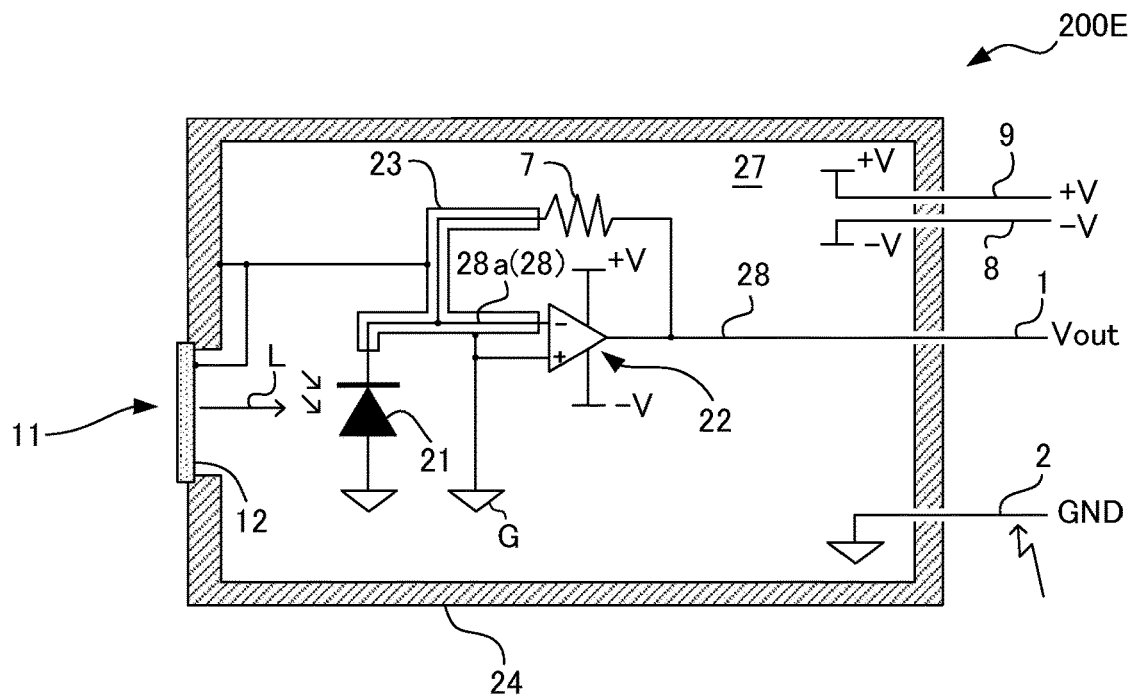
FIG. 8 is a schematic view of a fourth variation of the measuring apparatus illustrated in FIG. 1.
Figure 9:
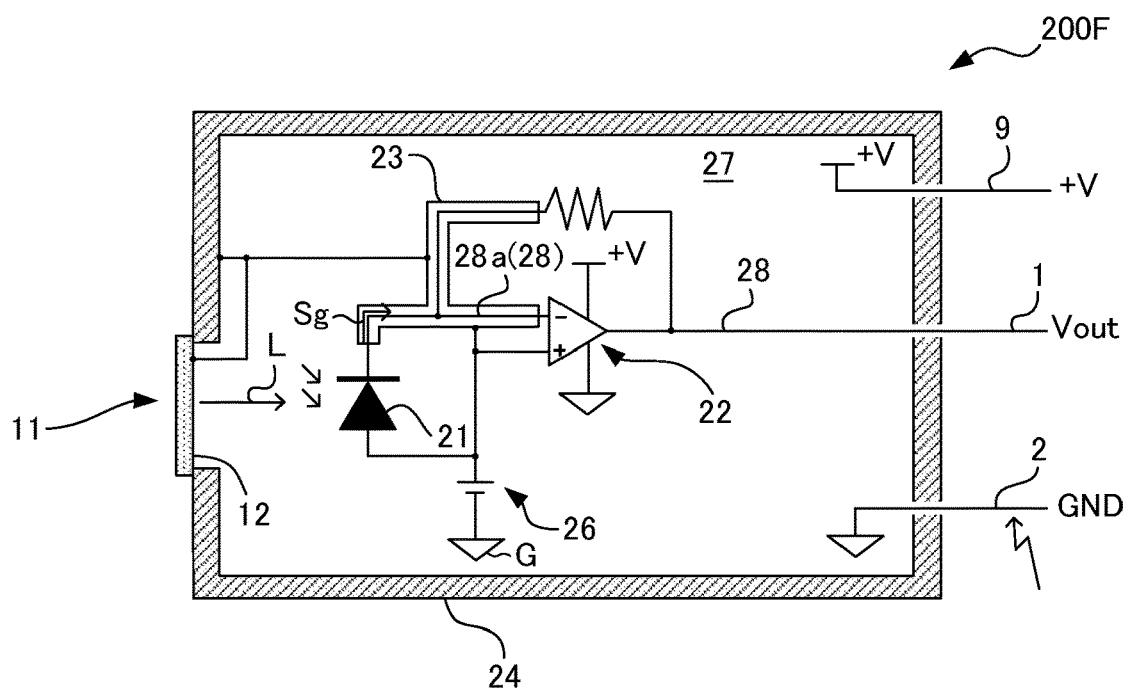
FIG. 9 is a schematic view of a variation of the measuring apparatus illustrated in FIG. 4.
Figure 10:
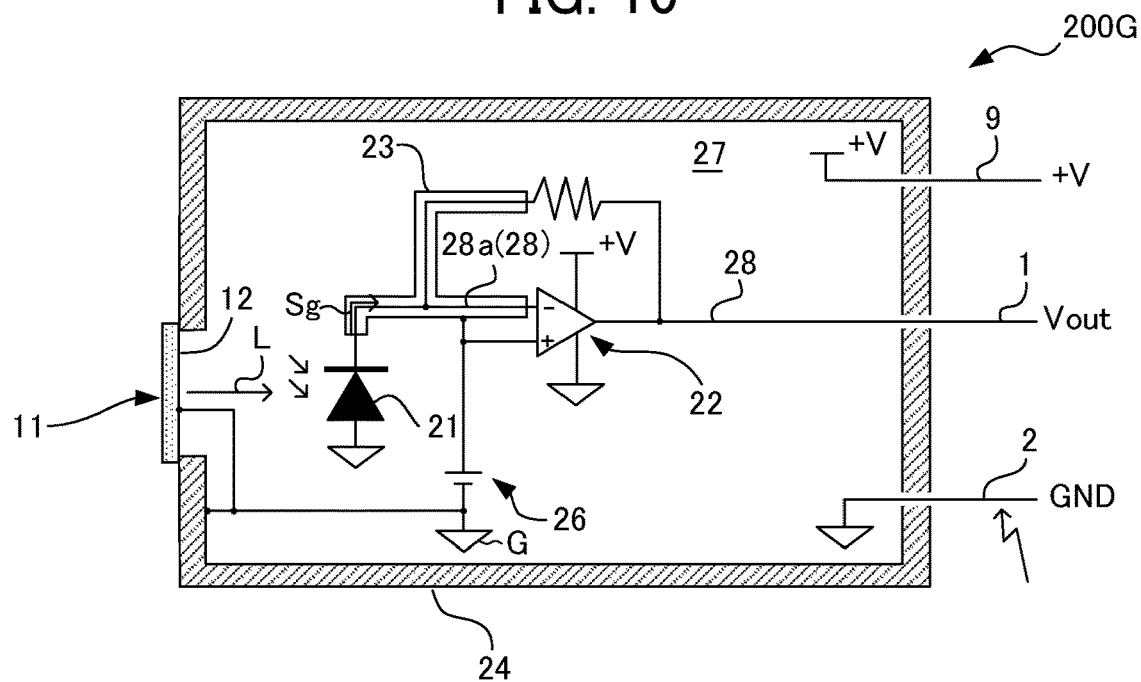
FIG. 10 is a schematic view of a variation of the measuring apparatus illustrated in FIG. 5.
Figure 11:
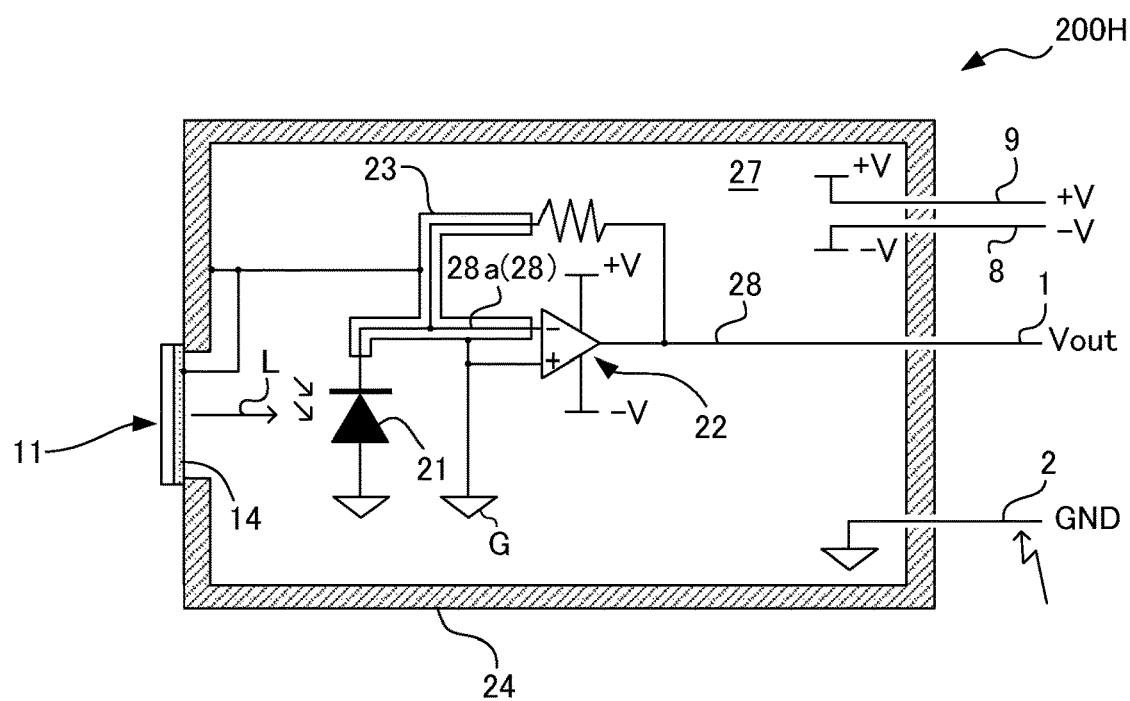
FIG. 11 is a schematic view of a variation of the measuring apparatus illustrated in FIG. 6.
Figure 12:
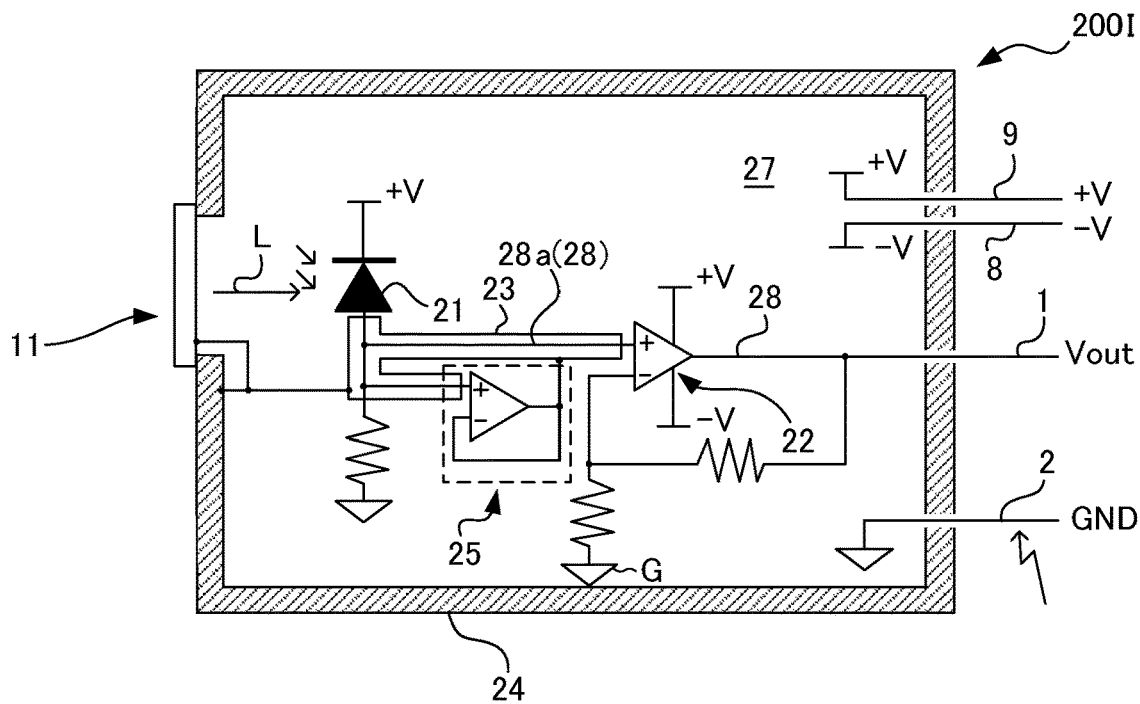
FIG. 12 is a schematic view of a variation of the measuring apparatus illustrated in FIG. 7.
Figure 13:
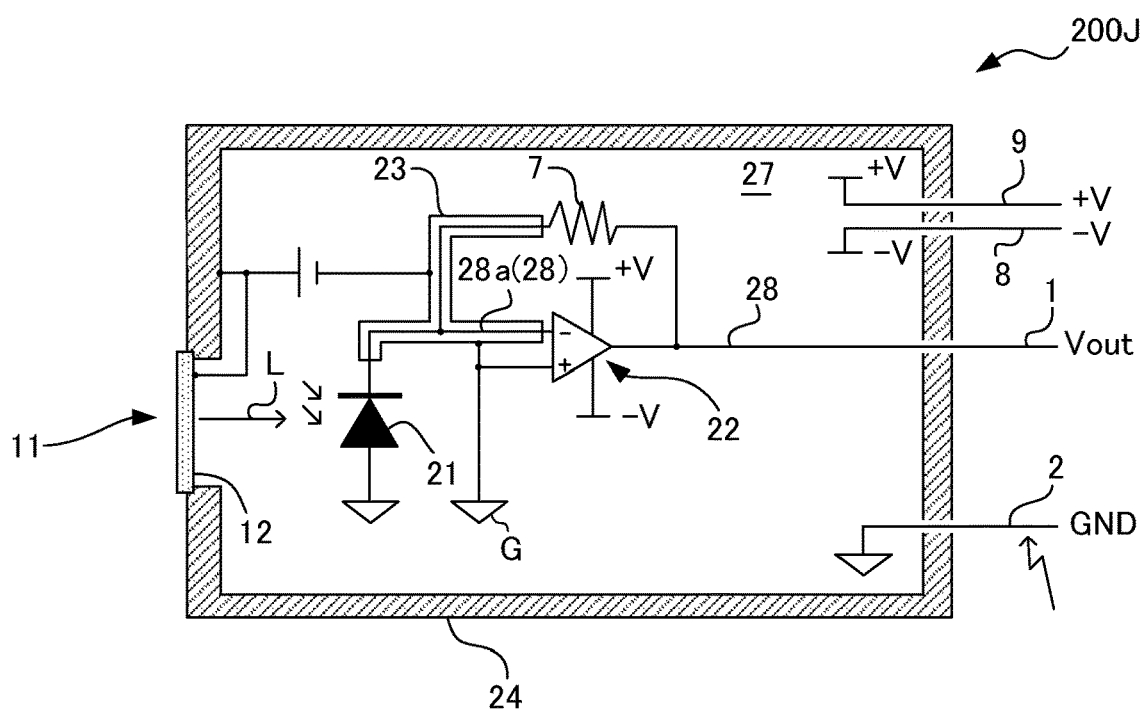
FIG. 13 is a schematic view of a variation of the measuring apparatus illustrated in FIG. 8.
Figure 14:
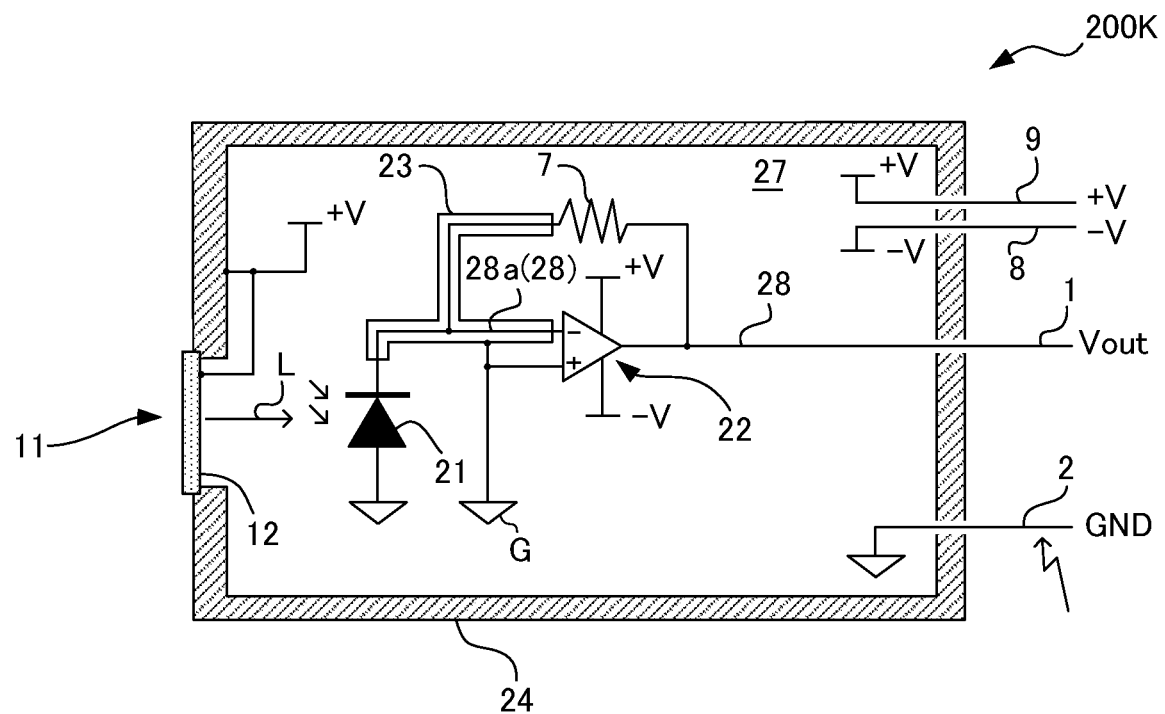
FIG. 14 is a schematic view of another variation of the measuring apparatus illustrated in FIG. 8.

Specifically, FIG. 8 is a schematic view of an integrated measuring apparatus 200E, as a fourth variation of the measuring apparatus 200 illustrated in FIG. 1. FIG. 9 is a schematic view of an integrated measuring apparatus 200F, as a variation of the measuring apparatus 200A illustrated in FIG. 4. FIG. 10 is a schematic view of an integrated measuring apparatus 200G, as a variation of the measuring apparatus 200B illustrated in FIG. 5. FIG. 11 is a schematic view of an integrated measuring apparatus 200H, as a variation of the measuring apparatus 200C illustrated in FIG. 6. FIG. 12 is a schematic view of an integrated measuring apparatus 200I, as a variation of the measuring apparatus 200D illustrated in FIG. 7. FIG. 13 is a schematic view of an integrated measuring apparatus 200J, as a variation of the measuring apparatus 200E illustrated in FIG. 8. FIG. 14 is a schematic view of an integrated measuring apparatus 200K, as another variation of the measuring apparatus 200E illustrated in FIG. 8.

The integrated measuring apparatuses 200E through 200K exclude the cable 31 and the external connectors 30a and 30b. Accordingly, the light receiving device 21 and the amplifier 22 are disposed closer to each other in the integrated measuring apparatuses 200E through 200K, compared to the measuring apparatuses 200 and 200A through 200D each being disposed independently from the amplifying apparatus 201. In other words, the amplifier 22 is connected to the light receiving device 21 via the electrical connection line 28a to amplify the electrical signal Sg output by the measuring apparatus 200. Therefore, the integrated measuring apparatuses 200E through 200K facilitates reduction of noise.

Accordingly, the measuring apparatuses of the embodiments described above facilitates detection of weak light having a very low light intensity.

Although the present disclosure makes reference to specific embodiments, it is to be noted that the present disclosure is not limited to the details of the embodiments described above. Thus, various modifications and enhancements are possible in light of the above teachings, without departing from the scope of the present disclosure. It is therefore to be understood that the present disclosure may be practiced otherwise than as specifically described herein. For example, elements and/or features of different embodiments may be combined with each other and/or substituted for each other within the scope of the present disclosure. The number of constituent elements and their locations, shapes, and so forth are not limited to any of the structure for performing the methodology illustrated in the drawings.

What is claimed is:

1. A measuring apparatus comprising:
   a light receiving device to receive light and output a signal;
   a housing, made of a conductive material, to cover the light receiving device;
   an optical window to transmit the light, the optical window including a conductive part having conductivity;
   an electrical connection line to transmit the signal; and a line enclosure disposed around the electrical connection line and electrically connected to the conductive part and the housing.

2. The measuring apparatus according to claim 1, further comprising an amplifier connected to the light receiving device via the electrical connection line to amplify the signal output by the light receiving device.

3. The measuring apparatus according to claim 1,
wherein the conductive part, the housing, and the line enclosure have identical electric potentials.

4. The measuring apparatus according to claim 1,
wherein the conductive part includes a portion of the optical window subjected to a conductive treatment.

5. The measuring apparatus according to claim 1,
wherein the conductive part includes a conductive film disposed in contact with the optical window.

6. The measuring apparatus according to claim 1, further comprising a ground,
wherein the conductive part, the housing, and the line enclosure are connected to the ground.

7. The measuring apparatus according to claim 1, further comprising a ground,
wherein the housing and the conductive part are connected to the ground to maintain a constant voltage between the line enclosure and the ground.

* * * * *